United States Patent [19]

Chang et al.

[11] Patent Number: 5,661,432

[45] Date of Patent: Aug. 26, 1997

[54] LINEAR TUNABLE GM-C INTEGRATOR

[75] Inventors: Zhong Yuan Chang, Antwerp; Didier René Haspeslagh, Harelbeke, both of Belgium

[73] Assignee: Alcatel N.V., Netherlands

[21] Appl. No.: 588,345

[22] Filed: Jan. 18, 1996

[30] Foreign Application Priority Data

Feb. 10, 1995 [EP] European Pat. Off. ............ 95200330

[51] Int. Cl.$^6$ .............................. H03F 3/45; H03F 3/191
[52] U.S. Cl. .................... 327/552; 327/553; 327/562; 327/103
[58] Field of Search ........................ 327/336, 345, 327/103, 552, 553, 561–563, 557; 330/301–306, 252, 253

[56] References Cited

U.S. PATENT DOCUMENTS

| | | | |
|---|---|---|---|
| 5,081,423 | 1/1992 | Koyama et al. | 327/341 |
| 5,225,790 | 7/1993 | Noguchi et al. | 330/260 |
| 5,384,501 | 1/1995 | Koyama et al. | 327/336 |
| 5,440,264 | 8/1995 | Sevenhans et al. | 327/553 |
| 5,465,070 | 11/1995 | Koyama et al. | 330/260 |
| 5,471,168 | 11/1995 | Sevenhans et al. | 327/553 |
| 5,559,470 | 9/1996 | Laber et al. | 330/252 |

OTHER PUBLICATIONS

"Very high linearity tunable OTA in 5 V CMOS" by A.M. Durham et al, IEE Proceedings-G, vol. 140, No. 3, Jun. 1993, pp. 207–210.

Primary Examiner—Timothy P. Callahan
Assistant Examiner—T. T. Lam
Attorney, Agent, or Firm—Ware, Fressola, Van Der Sluys & Adolphson LLP

[57] ABSTRACT

A time-continuous tunable Gm-C integrator including a "super Gm" differential input stage (O1; MI1/O2, MI2) and using linear and constant degeneration resistors (R1/R2) for obtaining the most optimal linear input-voltage to output-current conversion is tunable in a time-continuous manner. The integrator is provided with three tuning CMOS transistors (MU1, MU2, MU3) controlling the integrating currents flowing between the input stages and from the input stages towards the outputs (OP/ON). By a suitable control of the tuning transistors and owing to the fact that the voltage swing across the latter is small, it is possible to obtain a perfectly linear transconductance (Gm) characteristic over the whole operating range of the integrator.

7 Claims, 1 Drawing Sheet

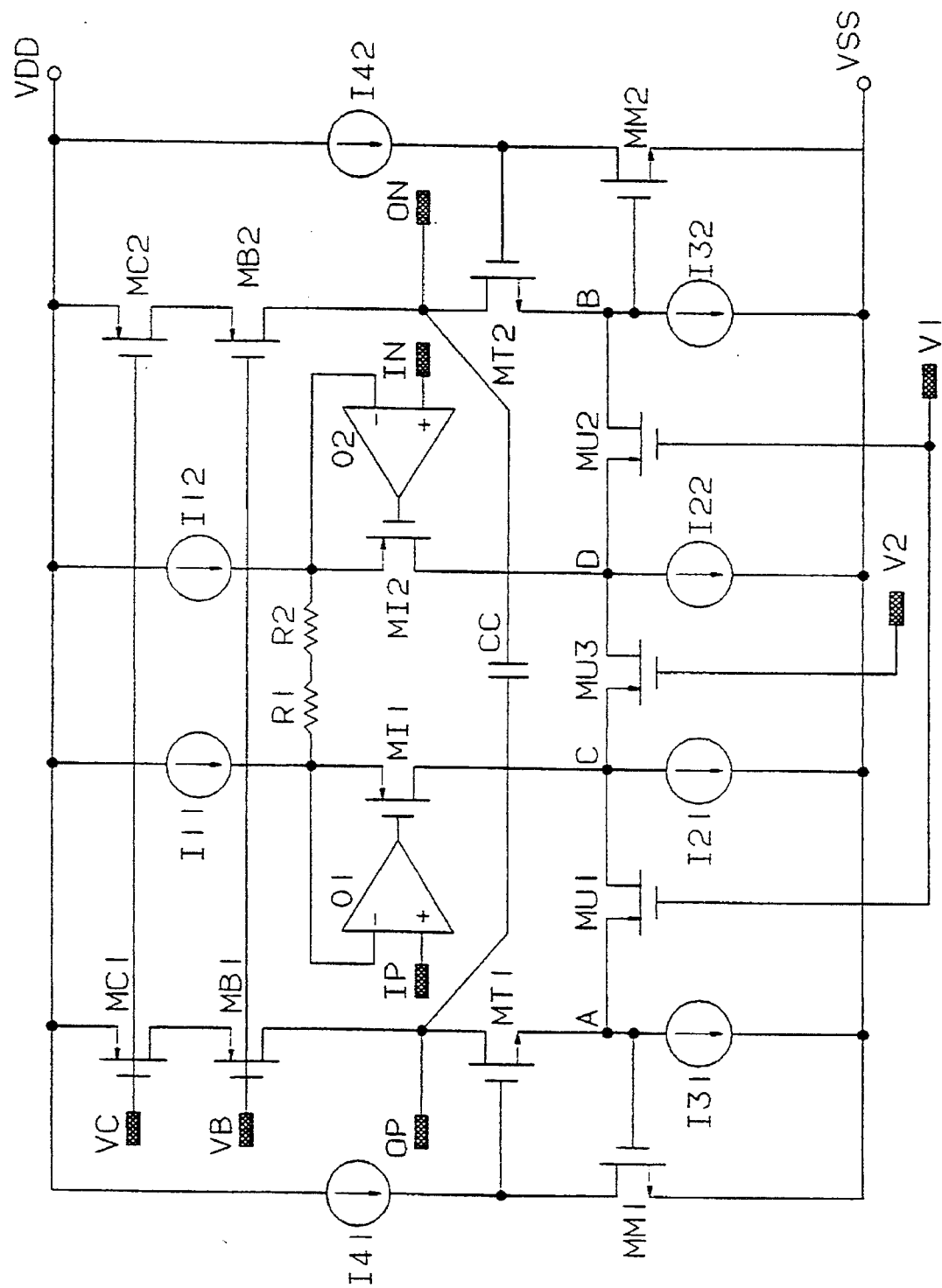

LINEAR TUNABLE GM-C INTEGRATOR

TECHNICAL FIELD

The present invention relates to a linear tunable Gm-C integrator including between a first and a second supply terminal two parallel branches each comprising the series connection of a first current source; a first junction point, a first active device, a second junction point and second current source, differential inputs of said integrator are coupled to said first active devices and said second junction points are coupled to differential outputs of said integrator via respective second active devices, said first junction points are further interconnected via resistive means and said differential outputs are interconnected via a capacitive means.

BACKGROUND OF THE INVENTION

Such an integrator is generally known in the art and a problem therewith is to linearize its output-current versus input-voltage characteristic. This characteristic is a function of the transconductance Gm of the integrator and has to stay linear over the whole tuning range. The linearization is generally obtained by suppressing the non-linear components of the first active devices or by using degeneration techniques. On the one hand, it is well known that suppression requires accurate components matching perfectly and is thus not easy to realize in practice. On the other hand, degeneration techniques consist of using linear passive resistors as resistive means and gives good linearity. However, since the integrator is built in an electronic chip, on-chip resistors are subjected to temperature drifts and are process dependent. As result, it is again not easy to obtain a linear integrator only by adjusting the value of the resistive means. Therefore, only non time-continuously tuned integrators based on this technique are available up to now.

Such a non time-continuous integrator is for instance known from the article "Very high linearity tunable OTA in 5 V CMOS"; by A. M. Durham et al, published in the IEE PROCEEDINGS-G, Vol. 140, No. 3, JUNE 1993, pages 207 to 210. Therein, a solution is disclosed to tune the Gm value of a source degeneration integrator by using a switchable current mirror controlled by digital words. A lot of overhead is needed to perform the tuning because of the high amount of digital words used, and both the tuning range and the accuracy thereof are limited by the number of bits used in each digital word.

DISCLOSURE OF INVENTION

An object of the present invention is to provide an integrator which is accurately tunable in a time-continuous manner while using a minimum of overhead and which is relatively easy to realize.

According to the invention, this object is achieved due to the fact that said integrator further includes tuning control means coupled to said second junction points and to said second active devices, and adapted to deviate currents therefrom under the control of tuning control signals.

it will be shown in more detail below that in this way it is possible to tune the transconductance Gm of the integrator by adjusting the tuning control signals.

In more detail, said first active devices include first CMOS transistors and said tuning control means includes a third active device interconnecting said second junction points, and includes a pair of fourth active devices each connecting one of said second junction points to one of said second active devices, said third and fourth active devices being controlled by said tuning control signals.

The third and fourth active devices are used to deviate portions of the currents flowing through the first active devices towards the capacitive means and/or between the second junction points. These third and fourth active devices operate in their linear region and experience only a small voltage swing over their terminals whereby a high linearity is obtained. As a result, a linear time-continuous tuning of the transconductance Gm of the integrator is obtained only by adjusting the tuning control signals. Compared with the above mentioned existing tuning techniques, the DC biasing condition of the present integrator is not changed whereby stable performances are obtained over the whole tuning range.

Another characteristic feature of the present invention is that said third and fourth active devices are respectively third and fourth CMOS transistors, that the gate electrodes of said fourth CMOS transistors are interconnected, and that said tuning control signals are applied as a differential control voltage between the gate electrode of said third CMOS transistor and the common gate electrodes of said fourth CMOS transistors.

As already mentioned, the third and fourth active devices, which are the tuning transistors of the integrator, experience only a small voltage swing across their drain and source electrodes and thereby operate in a very linear way. It can further be shown that as long as the voltage across the third tuning transistor is differential, no distortion will be generated by these tuning transistors.

Still another characteristic feature of the present invention is that the CMOS transistor of each of said first active devices interconnects said first and second junction points, and that each of said first active devices further includes an operational amplifier to the non-inverting input of which said differential input is connected and to the inverting input of which said first junction point is connected, the output of said amplifier being connected to the gate electrode of the first CMOS transistor of the same branch.

In this way, the integrator includes a so-called "super Gm input stage" which is known in the art as performing the most optimal linear voltage-to-current conversion.

The above mentioned and other objects and features of the invention will become more apparent and the invention itself will be best understood by referring to the following description of an embodiment taken in conjunction with the accompanying drawing.

BRIEF DESCRIPTION OF THE DRAWING

The sole FIGURE shows a Gm-C integrator according to the invention.

BEST MODE FOR CARRYING OUT THE INVENTION

The Gm-C integrator shown in the drawing is for use in bandpass filters performing accurate channel separation and out of band noise filtering in a Video On Demand (VOD) application. The Gm-C architecture is chosen because of its low power and high frequency capability. In this application, one filter is associated with a slow channel (24 kHz to 96 kHz) of an up-link from subscribers to a central office, while another filter is associated with a fast channel (138 kHz to 768 kHz) of a down-link whereon up to 6 Mbit/s video information is transmitted to the subscribers.

The filters operate according to a continuous-time bandpass filtering scheme in order to perform the required channel separation in the narrow transition band of 96 kHz to 138 kHz. This can be realized, owing to the Gm-C integrator described below and which is designed to achieve more than 60 dB linearity over the filter in which it is included.

The Gm-C integrator of the invention includes, between supply terminals VDD and VSS, two main parallel branches each constituted by the series connection of a first current source I11/I12, the source-to-drain path of an input CMOS transistor MI1/MI2 and a second current source I21/I22, respectively. Differential input terminals IP/IN are each connected to a non-inverting input (+) of a respective operational amplifier O1/O2 of which the output is connected to the gate electrode of an associated input CMOS transistor MI1/MI2 belonging to the same branch. In each branch, the junction point between the first current source I11/I12 and the source electrode of the input CMOS transistor MI1/MI2 is connected to the inverting input (−) of the operational amplifier O1/O2 of that branch, while these two junction points are interconnected by the series connection of identical linear resistors R1 and R2, R1 and R2 are known as source degeneration resistors.

The integrator further includes between VDD and VSS two parallel biasing branches each constituted by the series connection of a Common Mode Feed Back (CMFB) CMOS transistor MC1/MC2, a bias CMOS transistor MB1/MB2, a cascode mounted CMOS transistor MT1/MT2 and a third current source I31/I32 respectively. In each biasing branch, the junction point A/B between the cascode transistor MT1/MT2 and the third current source I31/I41 is connected to the gate electrode of a CMOS transistor MM1/MM2 having its source electrode connected to the supply terminal VSS and its drain electrode connected to the gate electrode of transistor MT1/MT2 respectively. The later gate electrode of MT1/MT2 is further also connected to the supply terminal VDD via a fourth current source I41/I42. The integrator is further also provided with a Common Mode Feed Back control input terminal VC connected to the common gate electrodes of the transistors MC1 and MC2, as well as with a bias control input terminal VB connected to the common gate electrodes of the transistors MB1 and MB2. The junction points between the drain electrodes of the transistors MB1/MB2 and MT1/MT2 constitute differential output terminals OP/ON of the integrator and are interconnected via an integrating capacitor CC.

The time-continuous tuning of the integrator is obtained by CMOS tuning transistors MU1, MU2 and MU3. The main path of transistor MU1/MU2 interconnects the junction point C/D of the input transistor MI1/MI2 and the second current source I21/I22 with the junction point A/B of the cascode transistor MT1/MT2 and the third current source I31/I32 respectively, while the source-to-drain path of transistor MU3 interconnects the junction C and D. Finally, the gate electrodes of the transistors MU1 and MU2 are interconnected.

A differential control voltage is applied to these tuning transistors MU1–MU3 in order to perform the correct time-continuous tuning. This control voltage is constituted by tuning control signals V1, V2 which are supplied to like-named respective tuning control input terminals. The tuning control terminal V1 is connected to the gate electrodes of the tuning transistors MU1 and MU2, while the tuning control terminal V2 is connected to the gate electrode of the tuning transistor MU3.

In this Gm-C integrator, the transconductance Gm is given by:

$$I = Gm \times V$$

where:

I is the output current;

V is the input voltage; and

Gm is the transconductance.

It will now be shown that the transconductance Gm is linear over the whole operating range of the integrator.

The above input circuit including the input CMOS transistors MI1, MI2 and the operational amplifiers O1, O2 is known in the art as a "Super Gm input stage" which, as input stage, realizes the most optimal linear input-voltage versus output-current (V-I) conversion.

Moreover, without tuning, the transconductance Gm of the integrator is simply given by 1/R where R is the resistive value of the source degeneration resistors R1 and R2 in series. As these resistors are linear, a perfectly linear transconductance Gm is obtained at this stage over the whole operating range of the integrator.

The tuning transistors MU1 to MU3 control the currents flowing from the input transistors MI1 and MI2 to the output terminals OP and ON, i.e., to the integrating capacitor CC. To this end, the tuning transistor MU3 deviates a portion of the currents of the input transistors MI1, MI2 between the junction points C and D, while the tuning transistors MU1 and MU2 allow another portion of these currents to flow towards the output terminals OP and ON respectively. The amount of currents deviated by the tuning transistors MU1 to MU3 is controlled by the tuning control signals V1 and V2.

The tuning transistors MU1 to MU3 experience only a small voltage swing over their source-to-drain path. As a result, they operate in their linear region and a high linearity of the transconductance Gm is obtained. Furthermore, it can be shown that as long as the voltage across the tuning transistor MU3 is differential, no distortion will be generated by these tuning transistors.

The transconductance Gm of the present integrator is given by:

$$Gm = \frac{1}{R} \left( \frac{1}{2} + \frac{Vc}{Vcm - VT - VA} \right)$$

where:

R is the resistive value of the resistors R1 and R2 in series;

Vc is the differential control voltage V1−V2;

Vcm is the common mode control voltage (V1+V2)/2;

VT is the threshold voltage; and

VA is the voltage at the junction point C.

Since all the parameters are independent of the input signal, the transconductance Gm is linear.

In a practical case where Vcm=3 Volt, VT=1 Volt and VA=1 Volt, the transconductance Gm can be tuned from 28% to 72% of its maximum value for a control voltage ranging from −0.5 Volt to +0.5 Volt. Moreover, contrary to the above mentioned known techniques, the present integrator does not change any DC biasing condition of the integrator whereby a stable performance is obtained over the whole tuning range.

While the principles of the invention have been described above in connection with specific apparatus, it is to be clearly understood that this description is made only by way of example and not as a limitation on the scope of the invention.

We claim:

1. Linear tunable Gm-C integrator including between a first (VDD) and a second (VSS) supply terminal two parallel branches each comprising a series connection of a first current source (I11/I12), a first junction point, a first active device (MI1, O1/MI2, O2), a second junction point (C/D) and a second current source (I21/I22), wherein differential inputs (IP/IN) of said integrator are coupled to said first active device in each parallel branch, and said second junction point (C/D) in each parallel branch is coupled to differential outputs (OP/ON) of said integrator via a respective second active device (MT1/MT2), said first junction point in each parallel branch interconnected via resistive means (R1, R2) and said differential outputs (OP/ON) being interconnected via a capacitive means (CC), characterized in that said integrator further includes tuning control means (MU1-MU3) coupled to said second junction point (C/D) in each branch and to said second active device (MT1, MT2) in each branch, for deviating current therefrom under control of tuning control signals (V1, V2).

2. Integrator according to claim 1, characterized in that said first active device of each branch (MI1, O1/MI2, O2) includes a first CMOS transistor (MI1/MI2) and in that said tuning control means includes a third active device (MU3) interconnecting said second junction point (C/D) of each parallel branch, and includes a fourth active device connected to (MU1, MU2) each parallel branch, each connecting said second junction point (C/D) to said second active device (MT1, MT2), said third (MU3) and fourth (MU1, MU2) active devices for control by said tuning control signals (V1, V2).

3. Integrator according to claim 2, characterized in that said third (MU3) and fourth (MU1, MU2) active devices are respectively third and fourth CMOS transistors, in that gate electrodes of said fourth CMOS transistors are interconnected, and in that said tuning control signals (V1, V2) are applied as a differential control voltage between a gate electrode of said third CMOS transistor (MU3) and the interconnected gate electrodes of said fourth CMOS transistors (MU1, MU2).

4. Integrator according to claim 2, characterized for each of said two parallel branches in that the first CMOS transistor (MI1/MI2) of said first active device (MI1, O1/MI2, O2) interconnects said first junction point and said second (C/D) junction point, and in that said first active device (MI1, O1/MI2, O2) further includes an operational amplifier (O1/O2) to a non-inverting input (+) of which said differential input (IP, IN) is connected and to an inverting input (−) of which said first junction point is connected, wherein an output of said operational amplifier is connected to a gate electrode of the first CMOS transistor (MI1/MI2).

5. Integrator according to claim 2, characterized for each of said two parallel branches in that said second active device (MT1/MT2) is a second CMOS transistor coupled to said first supply terminal (VDD) via biasing means (MB1, MC1/MB2, MC2) and to said second supply terminal (VSS) via a third junction point (A/B) and a third current source (I31/I32), wherein a gate electrode of said second CMOS transistor (MT1/MT2) is connected to a fourth junction point, said fourth junction point is connected to said first supply terminal (VDD) via a fourth current source (I41/I42) and to said second supply terminal (VSS) via a fifth CMOS transistor (MM1/MM2).

6. Integrator according to claim 5, characterized for each of said two parallel branches in that said fourth active device (MU1/MU2) is connected between said second junction point (C/D) and said third junction point (A/B).

7. Integrator according to claim 1, characterized in that said resistive means (R1, R2) are linear resistors.

* * * * *

UNITED STATES PATENT AND TRADEMARK OFFICE
CERTIFICATE OF CORRECTION

PATENT NO. : 5,661,432
DATED      : August 26, 1997
INVENTOR(S): Chang e tal.

It is certified that error appears in the above-identified patent and that said Letters Patent is hereby corrected as shown below:

On the title page: Item

[57] Abstract

Line 2 replace "(01; MI1/02, MI2)" with --(01, MI1/02, MI2)--

Signed and Sealed this

Twenty-third Day of June, 1998

Attest:

BRUCE LEHMAN

Attesting Officer

Commissioner of Patents and Trademarks